United States Patent
Pfnuer et al.

(10) Patent No.: US 9,628,185 B2
(45) Date of Patent: Apr. 18, 2017

(54) OPTICAL TRANSMITTER WITH LINEAR ARRANGEMENT AND STACKED LASER PACKAGE AND RF PATH

(71) Applicant: Cisco Technology, Inc., San Jose, CA (US)

(72) Inventors: Stefan Martin Pfnuer, San Jose, CA (US); Matthew Joseph Traverso, Santa Clara, CA (US)

(73) Assignee: Cisco Technology, Inc., San Jose, CA (US)

( * ) Notice: Subject to any disclaimer, the term of this patent is extended or adjusted under 35 U.S.C. 154(b) by 116 days.

(21) Appl. No.: 14/517,414

(22) Filed: Oct. 17, 2014

(65) Prior Publication Data

US 2016/0112137 A1    Apr. 21, 2016

(51) Int. Cl.
| | |
|---|---|
| *H04B 10/50* | (2013.01) |
| *H01S 5/022* | (2006.01) |
| *H04B 10/516* | (2013.01) |
| *G02B 6/42* | (2006.01) |

(52) U.S. Cl.
CPC ......... *H04B 10/503* (2013.01); *G02B 6/4248* (2013.01); *G02B 6/4281* (2013.01); *H01S 5/0228* (2013.01); *H01S 5/02276* (2013.01); *H04B 10/516* (2013.01)

(58) Field of Classification Search
CPC .. H01S 5/02276; H01S 5/0228; H04B 10/503
See application file for complete search history.

(56) References Cited

U.S. PATENT DOCUMENTS

| | | | |
|---|---|---|---|
| 6,226,424 B1 * | 5/2001 | Ball | G02B 6/4201 385/14 |
| 7,172,348 B2 | 2/2007 | Yabe et al. | |
| 7,203,219 B2 | 4/2007 | Sabbatino et al. | |
| 8,475,057 B2 | 7/2013 | Kihara et al. | |
| 8,475,058 B2 | 7/2013 | Fujimura et al. | |
| 2009/0010600 A1 | 1/2009 | Kim et al. | |

(Continued)

FOREIGN PATENT DOCUMENTS

| | | |
|---|---|---|
| EP | 1615304 A1 | 1/2006 |
| WO | 99/15928 A1 | 4/1999 |

OTHER PUBLICATIONS

International Search Report for PCT/US2015/055731, Apr. 6, 2016.
U.S. Appl. No. 14/072,182, entitled Efficient Optical Communication Device, filed Nov. 5, 2013.

*Primary Examiner* — Nathan Curs
(74) *Attorney, Agent, or Firm* — Patterson + Sheridan LLP

(57) ABSTRACT

Described herein is an optical transmitter that includes an RF signal path that is, at least partially, parallel with an optical signal path. In one embodiment, an electrical transmission element, which defines the RF signal path, is disposed between a laser emitting the optical signal and a side wall of a package containing the optical transmitter. Although the RF and optical signals may propagate along different planes within the optical transmitter, both signals are received at an optical modulator. Using the RF signal, the optical modulator modulates the optical signal (e.g., a continuous wave) to generate a modulated optical signal. The optical modulator then outputs the modulated signal to a receptacle coupled to a light carrying medium such as a fiber optic cable.

18 Claims, 6 Drawing Sheets

(56) References Cited

U.S. PATENT DOCUMENTS

| | | | |
|---|---|---|---|
| 2013/0121702 A1* | 5/2013 | Han | G02B 6/4201 |
| | | | 398/115 |
| 2013/0155642 A1 | 6/2013 | McColloch | |
| 2013/0222908 A1 | 8/2013 | Yeh et al. | |
| 2014/0270784 A1* | 9/2014 | Thacker | G02B 6/4284 |
| | | | 398/115 |
| 2015/0104177 A1* | 4/2015 | Kato | H04B 10/40 |
| | | | 398/79 |
| 2015/0372781 A1* | 12/2015 | Frankel | H04J 14/0212 |
| | | | 398/47 |

* cited by examiner

OPTICAL TRANSMITTER WITH LINEAR ARRANGEMENT AND STACKED LASER PACKAGE AND RF PATH

TECHNICAL FIELD

Embodiments presented in this disclosure generally relate to optical transmitters. More specifically, embodiments disclosed herein use an RF path that is parallel and vertically staked to an optical path in the transmitter.

BACKGROUND

Transmitting optical sub-assemblies (TOSAs) used for LAN, wavelength division multiplexing (WDM), or dense wavelength division multiplexing (DWDM) high speed data communication with greater than 40 gigabyte (Gb) transmission rates typically include a continuous light source in the form of one or more semiconductor lasers aligned to an optical modulator section where light is coupled from the laser to the modulator input with the help of individual lenses or lens arrays (to minimize alignment effort). Typically, the lens(es) and modulator are hermetically sealed inside a suitable enclosure to cool the components without forming condensation and to control or tune the wavelength of the laser.

Small form factor transceivers that include TOSAs, like Quad Small Form-factor Pluggable (QSFP or QSFP+), QSFP28, and Small Form-factor Pluggable (SPF), are compact and low cost solutions for optical data transmission. Transmission rates of 40 Gb and 100 Gb often require two PCBs to accommodate all the required components which leaves little space for the transmit and receive portions of the transceivers.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1:
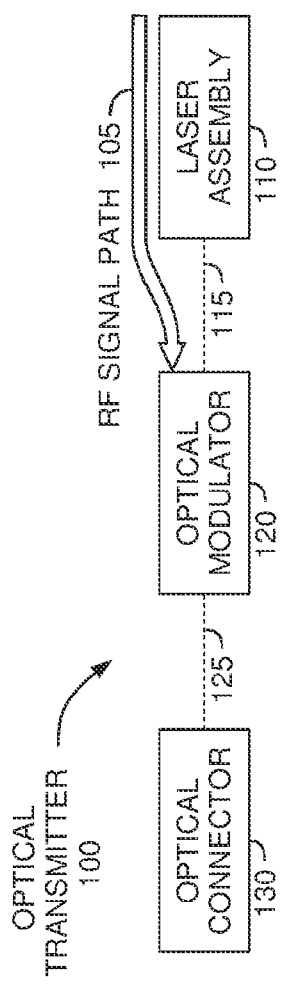
FIG. 1 illustrates an optical transmitter that includes an RF signal path that is vertically stacked and parallel with an optical signal path, according to one embodiment disclosed herein.

One embodiment presented in this disclosure describes an optical system that includes a laser assembly in a hermetic enclosure and an optical modulator external to the hermetic enclosure where the optical modulator is configured to receive an optical signal generated by the laser assembly and modulate the optical signal based on received data signals. The optical system also includes a casing containing the hermetic enclosure and the optical modulator and an electrical transmission element disposed between the hermetic enclosure and a sidewall of the casing. Moreover, the electrical transmission element extends, at least partially, along a first axis that is parallel to a second axis on which the optical signal propagates between the laser assembly and the optical modulator and the electrical transmission element is configured to provide the data signals to the optical modulator.

Another embodiment described herein is a method for operating an optical transmitter. The method includes transmitting data signals on an electrical transmission element where a portion of the electrical transmission element extends along a first axis and transmitting an optical signal from a hermetic enclosure to an optical modulator along a second axis parallel to the first axis where the portion of the electrical transmission element is disposed between the hermetic enclosure and a sidewall of a casing of the optical transmitter that is parallel to the first axis. The method also includes receiving the data signals and the optical signal at the optical modulator and modulating the optical signal based on the data signals.

Another embodiment described herein is an optical transmitter that includes a laser in a hermetic enclosure and an optical modulator configured to receive an optical signal generated by the laser assembly where the optical modulator is external to the hermetic enclosure and is configured to modulate the optical signal based on received data signals. The transmitter also includes a receptacle configured to receive the modulated optical signal from the optical modulator and physically couple to a light carrying medium for transmission of the modulated optical signal. Moreover, the optical modulator is configured to both receive the optical signal from the laser assembly and transmit the optical signal to the receptacle in a common direction.

Example Embodiments

Embodiments disclosed herein describe optical transmitters that include an RF signal path that is, at least partially, parallel to an optical signal path. Furthermore, the RF and optical signal paths may be vertically stacked. In one embodiment, an electrical transmission element that carries the RF signal is disposed between a laser emitting the optical signal and a side wall of a casing containing the optical transmitter. Although the RF and optical signals may propagate along different planes within the optical transmitter, both signals are received at an optical modulator. Using the RF data signal, the optical modulator modulates the optical signal (e.g., a continuous wave) to generate a modulated signal. The optical modulator then outputs the modulated signal which may then be transmitted on a light carrying medium such as a fiber optic cable. In one embodiment, by using this arrangement, the optical transmitter may fit within the small form factor of, for example, a QSFP+, QSFP28, or SFP transceiver where space is limited and still achieve transmission rates greater than or equal to 40 Gb. Furthermore, the embodiments herein may use various optical wavelengths such as 4Ch LAN, WDM, or 1CH DWDM with tunable channels.

FIG. 1 illustrates an optical transmitter 100 that includes an RF signal path 105 and an optical signal path 115, according to one embodiment disclosed herein. As shown, at least a portion of the RF signal path 105 is vertically stacked and parallel to the optical signal path 115. Stated differently, the RF signal path 105 extends along a first axis that is parallel to a second axis defining the direction of propagation of the optical signal 115. In this example, the RF signal path 105 is vertically redirected in the portion of the path 105 that is between a laser assembly 110 and an optical modulator 120. In this manner, both the RF data signals propagating in the path 105 and the optical signal propagating in the path 115 are received by the optical modulator 120. However, in another embodiment, instead of redirecting the RF signal path 105, the optical signal path 115 may be redirected using, for example, one or more mirrors or lenses. Furthermore, in some embodiments, the paths 105 and 115 may be spaced close enough that neither path needs to be redirected in order to be received at the optical modulator 120. For example, the respective axes of propagation for the RF signal path 105 and optical signal path 115 may be parallel across their entire lengths.

The RF signal path 105 may be defined by an electrical transmission element such as a flex PCB, rigid PCB, wire, cable, and the like that is used to transmit the RF data signals. That is, the RF signal path 105 may take the shape of whatever electrical transmission element is used in the optical transmitter 100 to transmit the RF signal to the optical modulator 120. On the other hand, the optical signal may travel along path 115 in a gaseous environment (e.g., earth's atmosphere) or a vacuum. If desired, reflective surfaces may be used to redirect the path 115 in the transmitter 100. Alternatively, a light carrying medium such as a fiber optic cable may be used to define the optical signal path 115 and transmit the optical signal from the laser assembly 110 to the optical modulator 120.

The optical modulator 120 modulates the optical signal transmitted along path 115 using the RF data signals transmitted on path 105. For example, the RF data signals may include one or more data signals or controls signals that instruct the optical modulator 120 to modulate the optical signal outputted by the laser assembly 110 in order to encode information into the optical signal. For example, the modulator 120 may use a modulator scheme to encode data carried in the RF signals into the optical signal. The modulator 120 then outputs the modulated optical signal into the optical connector 130 which may then be coupled to a fiber optic cable. Additional details about the optical modulator 120 and the laser assembly 110 will be provided later.

Although not shown in the side view of FIG. 1, in one embodiment, the transmitter 100 may include multiple laser assemblies 110 that each transmits respective optical signals along respective optical paths 115. The optical modulator 120 may encode different data onto the respective optical signals based on the RF signal. The optical modulator 120 may also multiplex the respective optical signals (which may be at different wavelengths) into a single multiplexed or combined optical signal that is transmitted to the connector 130.

Figure 2:
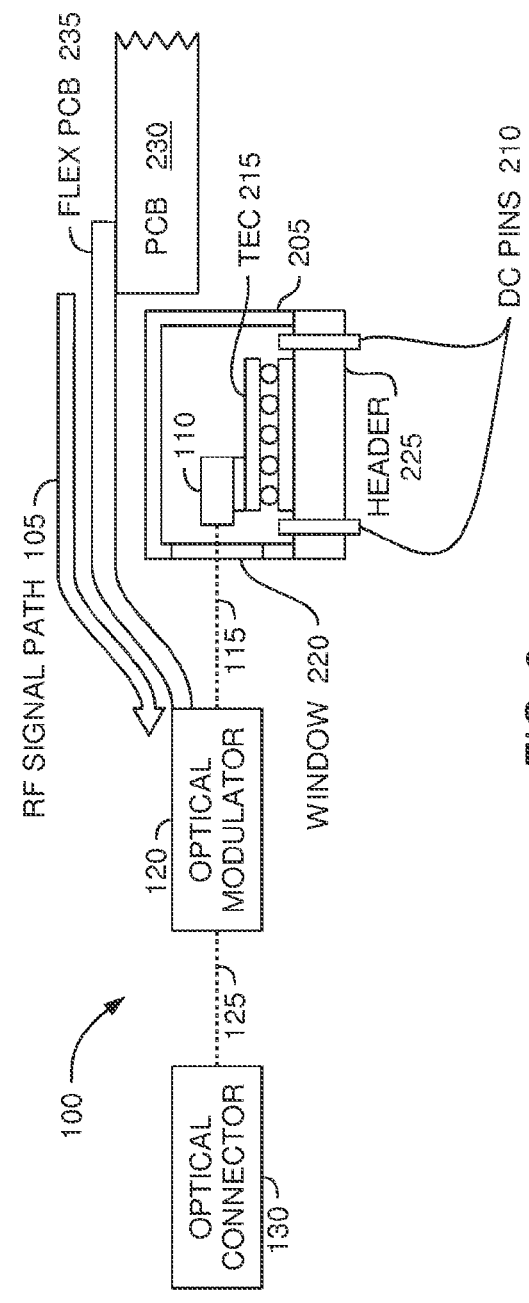
FIG. 2 illustrates an optical transmitter where the optical signal path is vertically stacked and parallel with an electrical transmission element establishing the RF signal path, according to one embodiment disclosed herein.

FIG. 2 illustrates the optical transmitter 100 where the optical signal path 115 is parallel to a flex PCB 235 establishing the RF signal path 105, according to one embodiment disclosed herein. As shown, the flex PCB 235 electrically couples the optical modulator 120 with PCB 230 which may be an inflexible PCB. To do so, the flex PCB 235 includes multiple signal paths or traces that transmit the RF signals from the PCB 230 to the modulator 120, and vice versa.

Although flex PCB is specifically shown in FIG. 2, other electrical transmission elements may be used. For example, one or more wires (e.g., wire bonds) or a cable may be used to couple the PCB 230 to the optical modulator 120. In one embodiment, the PCB 230 may extend over a hermetically sealed enclosure 205 and use wire bonds or one or more cables to transfer the RF signals to the optical modulator 120 assuming the height of the form factor of the transmitter 100 permits such an arrangement.

The laser assembly 110 is disposed in the hermetically sealed enclosure 205 in order to cool the assembly 110 and to control laser wavelength without forming condensation. As used herein "hermetically sealed" means the enclosure 205 is substantially airtight and is impervious to gasses such that condensation does not form on the laser assembly 110. To cool the laser assembly 110, the sealed enclosure 205 includes a thermoelectric cooler (TEC) 215 that is thermally coupled to the laser assembly 110. In one embodiment, the TEC 215 may be directly coupled to the laser assembly 110 or may be indirectly coupled to the assembly 110 via a thermally conductive material. Moreover, if the enclosure 205 includes multiple laser assemblies 110, the enclosure 205 may use the same TEC 215 to cool the assemblies 110 or use multiple TECs 215.

The enclosure 205 also includes a header 225 such as a transistor outline header (TO-header) that encapsulate DC pins 210 that extend from a bottom, exposed surface of the header 225 to a upper, enclosed surface. The DC pins 210 may be used to carry DC signals that power the laser assembly 110 (to activate the laser on the assembly 110) and the TEC 215. Advantageously, because the optical modulator 120 is located outside the sealed enclosure 205, the high speed RF data signals do not need to be routed into the enclosure 205 which may reduce the size, complexity, and cost of the enclosure 205.

The enclosure 205 also includes a window 220 that permits an optical signal generated by the laser assembly 110 to propagate along the optical path 115. In one embodiment, the optical signal is a continuous wave (CW) that is then modulated by the optical modulator 120 based on the data signals received by the flex PCB 235. As will be discussed later, the transmitter 100 may also include additional components for providing a heat sink or a thermal path for removing the heat generated by the laser assembly 110.

Instead of routing the RF data signals into the enclosure 205, these signals use the RF signal path 105 established by the flex PCB 235. In the embodiment shown, at least a portion of the RF signal path 105 (and the flex PCB 235) is parallel to the optical path 115. The flex PCB 235 may directly contact one or more of the sides of the enclosure 205 (e.g., a surface of the enclosure 205 facing the flex PCB 235). Alternatively, the flex PCB 235 may be spaced away from the enclosure 205 by a spacer material—i.e., a thermally or electrically insulative material. Furthermore, the distance separating the enclosure 205 and the optical modulator 120 may be sufficient to provide the flex PCB 235 with enough clearance to curve in order to make an electrical connection with the optical modulator 120.

Although FIG. 2 illustrates arranging the flex PCB 235 such that the PCB 235 faces a side of the enclosure 205 opposite the header 225 and DC pins 210, this is not a requirement. In other examples, the flex PCB 235 may face a side of the enclosure 205 that is perpendicular to the header 225. Further still, the flex PCB 235 may be routed at the bottom of the enclosure 205 assuming that the flex PCB 235 avoids the DC pins 210 and the transmitter 100 still has a thermal path to route heat away from the enclosure 205.

Figure 3A:
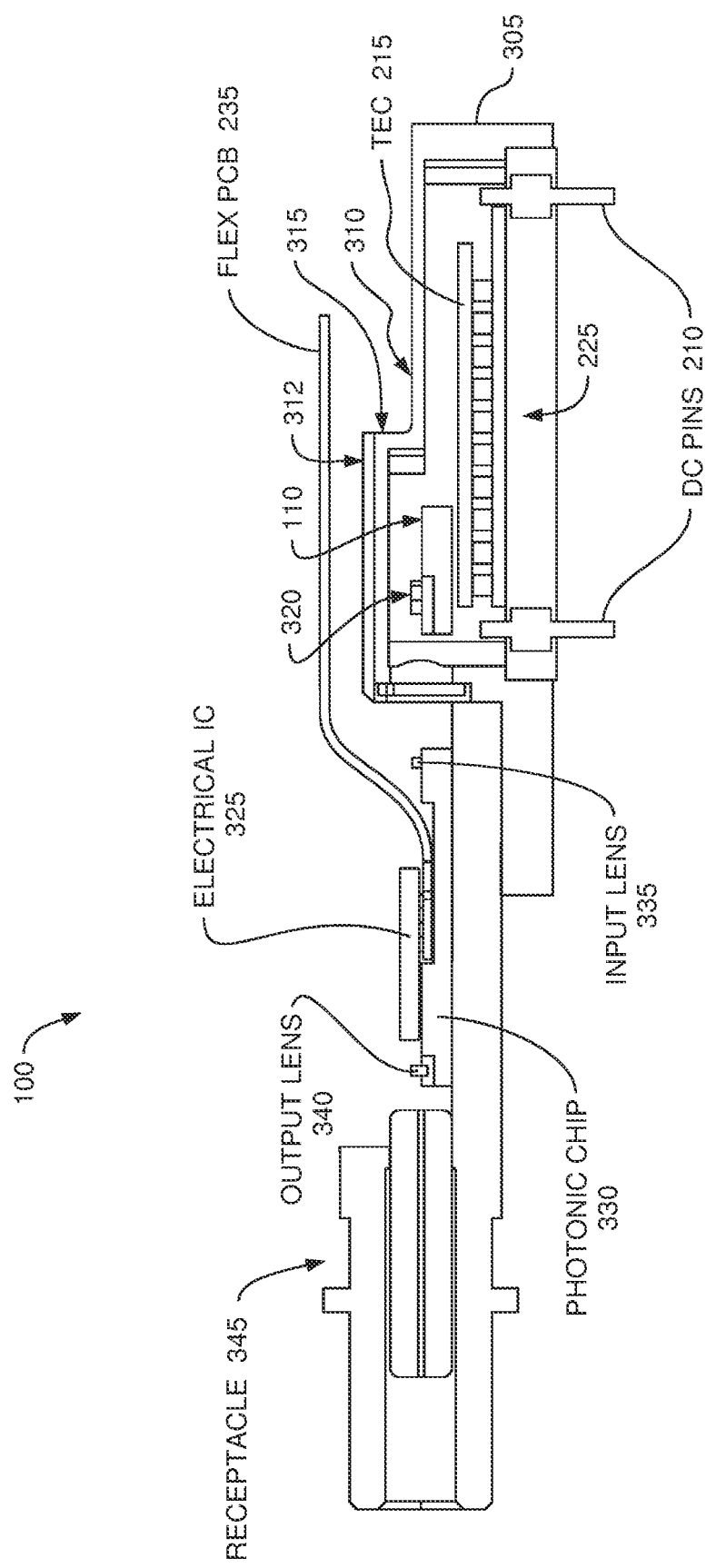
FIGS. 3A-3B illustrate an optical transmitter with an electrical integrated circuit and photonic chip for receiving the RF and optical signals, according to one embodiment disclosed herein.
Figure 3B:
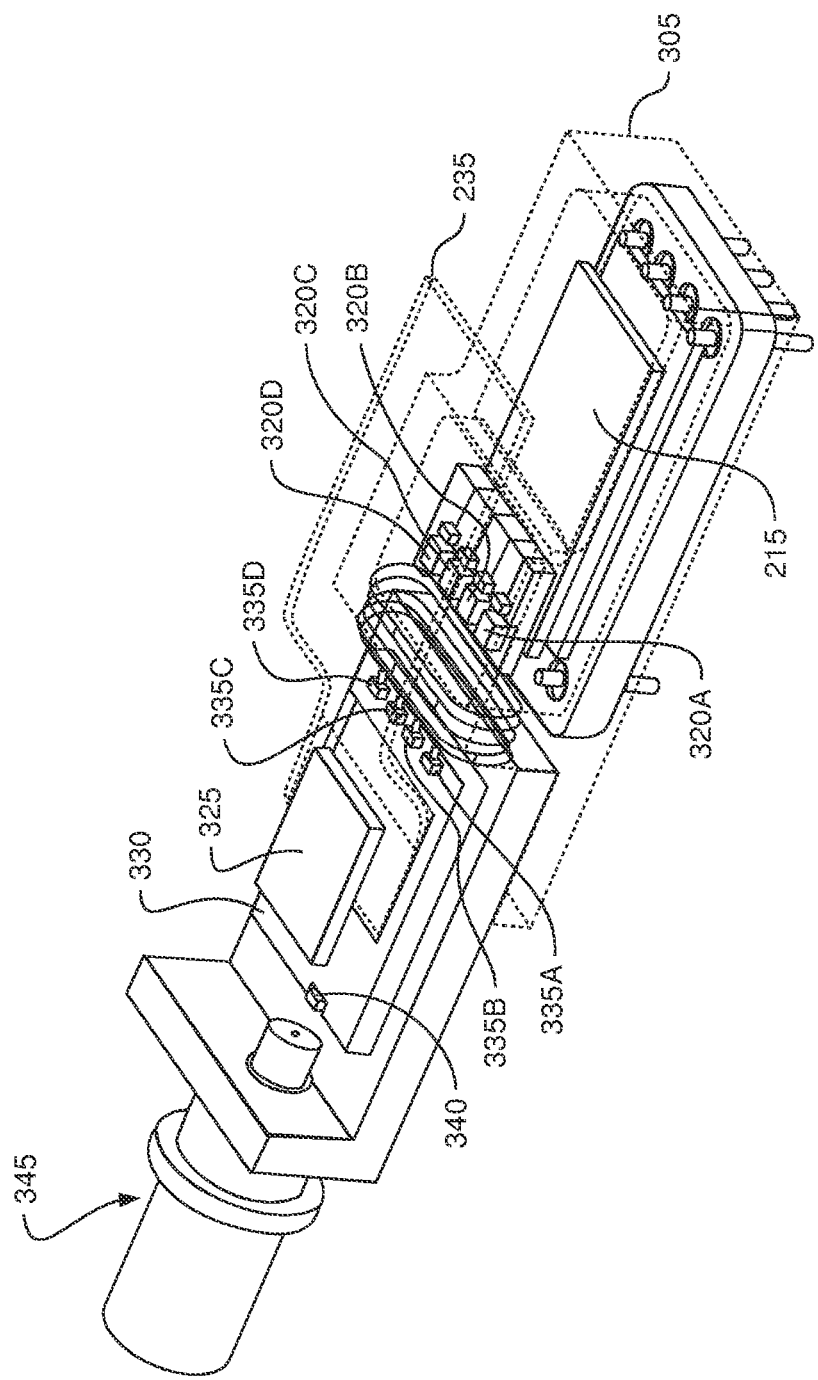

FIGS. 3A-3B illustrate the optical transmitter 100 with an electrical integrated circuit (IC) 325 and photonic chip 330 for receiving the RF and optical signals, according to one embodiment disclosed herein. Specifically, FIG. 3A illustrates a side view of the transmitter 100 while FIG. 3B illustrates a plan view of the transmitter 100. As shown, the optical modulator includes electrical IC 325 and photonic chip 330. Moreover, the flex PCB 235 may be electrically connected to the electrical IC 325, the photonic chip 330, or both IC 325 and chip 330. As shown here, a portion of the flex PCB 235 is disposed between the electrical IC 325 and photonic chip 330 and may include direct electrical connections to the IC 325 or the chip 330 (or both). However, in other embodiments, the flex PCB 235 may abut one side of the electrical IC 325 or the photonic chip 330. For example, the flex PCB 235 may terminate at the side of the chip 330 facing the laser assembly 110 (assuming the PCB 235 does not block the optical signal generated by the assembly 110 from being received at an input lens 335). The transmitter 100 may include a plurality of wire bonds that electrically couple the flex PCB 235 to the photonic chip 330. If the flex PCB 235 is coupled to the chip 330, using redistribution layers (not shown) in the chip 330, the data signals from the flex PCB 235 may be routed to the electrical IC 325. Several examples of connecting a signal carrying medium, such as flex PCB 235, to the IC 325 and photonic chip 330 of an optical modulator are described in patent application titled "DIRECT PRINTED CIRCUIT ROUTING TO STACKED OPTO-ELECTRICAL IC PACKAGES," Attorney Docket Number CPOL992995, by inventors Stefan Pfnuer, Matt Traverso, and Bipin Dama which is herein incorporated by reference.

Regardless of the technique used to electrical connect the flex PCB 235 to IC 325 and/or photonic chip 330, the electrical IC 325 uses the RF data signals transmitted on the flex PCB 235 to control the modulation of the optical signal received from a laser 320 on laser assembly 110. For example, the optical signal is received at the input lens 335 and then routed using one or more waveguides to a modulator (e.g., a Mach-Zehnder interferometer) embedded in the photonic chip 330. Electrical IC 325, which may have direct solder ball connections to the photonic chip 330, transmits controls signals to the modulator for controlling the modulation of the optical signal. Of course, the photonic chip 330 may include other electro-optic components besides the modulator for manipulating the optical signal(s). The photonic chip 330 then outputs the modulated optical signal using an output lens 340 to a receptacle 345 to transfer the modulated optical signal to a light carrying medium. In one embodiment, the receptacle 345 includes a form factor with an inner surface that aligns the light carrying medium, such as a fiber optical cable, with the modulated optical signal so that the optical signal propagates through the medium.

The electrical IC 325 may include CMOS circuitry that provides data signals to the photonic chip 330. The photonic chip 330 may also include CMOS circuitry along with optical components such as waveguides, phase modulators, optical splitters, and the like. These optical components transmit or carry optical signals through the photonic chip 330 and may use control signals received via the connections to the IC 325 or the flex PCB 235 to perform their respective functions. In one embodiment, the electrical IC 325, the photonic chip 330, or both are formed using a silicon substrate. For example, the photonic chip 330 may be formed from a silicon buried oxide structure (BOX). However, in other embodiments, the IC 325 and chip 330 are made from different materials (e.g., other suitable semiconductors or transmissive materials).

The hermetic enclosure 305 illustrated in FIG. 3A has a different shape or form factor than the enclosure 205 illustrated in FIG. 2. Here, enclosure 305 has a surface 310 that is recessed from the flex PCB 235 relative to a top surface 312. Stated differently, the top surface 312 is closer to the flex PCB 235 than recessed surface 310 relative to a direction normal to both of these surfaces 310, 312. The enclosure 205 is formed such that a sidewall 315 connects the recessed surface 310 to the top surface 312.

In one embodiment, the height of the sidewall 315 is selected to permit at least a portion of a PCB (not shown) to fit between the flex PCB 235 and the recessed surface 310. For example, comparing the enclosure 205 shown in FIG. 2 with the enclosure 305 shown in FIG. 3A (assuming both enclosures have the same total length) illustrates that the PCB 230 may be extend further in a direction towards the optical modulator 120 when enclosure 305 is used rather than enclosure 205. For example, in some embodiments where the vertical space (i.e., the up/down orientation shown in FIG. 2) is limited, the PCB 230 may be unable to extend past the rightmost wall of enclosure 205. However, in FIG. 3A, because surface 310 is recessed, the area above surface 310 permits the PCB 230 to extend further towards the optical modulator. Permitting PCB 230 to extend further in this direction may increase the surface area of the PCB 230. This additional surface area may provide additional space for mounting passive components (e.g., ICs, resistors, inductors, capacitors, etc) onto the PCB 230 which cannot typically be mounted on the flex PCB 235. That is, the arrangement shown in FIG. 3A may shorten the length of the flex PCB 235 and increase the length of the rigid PCB 230 relative to the arrangement in FIG. 2, thereby providing additional surface area on the rigid PCB 230 for disposing passive components which otherwise cannot reliable be mounted on the flex PCB 235.

The plan view shown in FIG. 3B illustrates that the enclosure 305 includes multiple lasers 320 that each generate an optical signal that is received using a corresponding input lens 335 on the photonic chip 330. Each laser 320 may be mounted on a respective laser assembly, or alternatively, the lasers 320 may share the same assembly. By using a plurality of lasers 320, the transmitter is able to combine the respective channels corresponding to the lasers 320 into a multiplexed or combined signal with greater data rates. For example, the photonic chip 330 and electrical IC 325 may modulate each of the optical signals (or channels) outputted from the lasers 320 to generate four 25 Gb signals. These signals may then be combined to result in a 100 Gb combined optical signal (e.g., the four channels are at different wavelengths). However, in other embodiments, the enclosure 305 may include only one laser 320 which is modulated by the IC 325 and chip 330 to result in the desired data transfer speed.

Moreover, FIG. 3B also illustrates that a portion of the flex PCB 235 is disposed between the electrical IC 325 and the photonic chip 330. As described above, the IC 325 may include direct connections (e.g., solder connections) to both flex PCB 235 and photonic chip 330 such that data signals provided by the flex PCB 235 may be used to control the optical modulation performed in the photonic chip 330.

Figure 4:
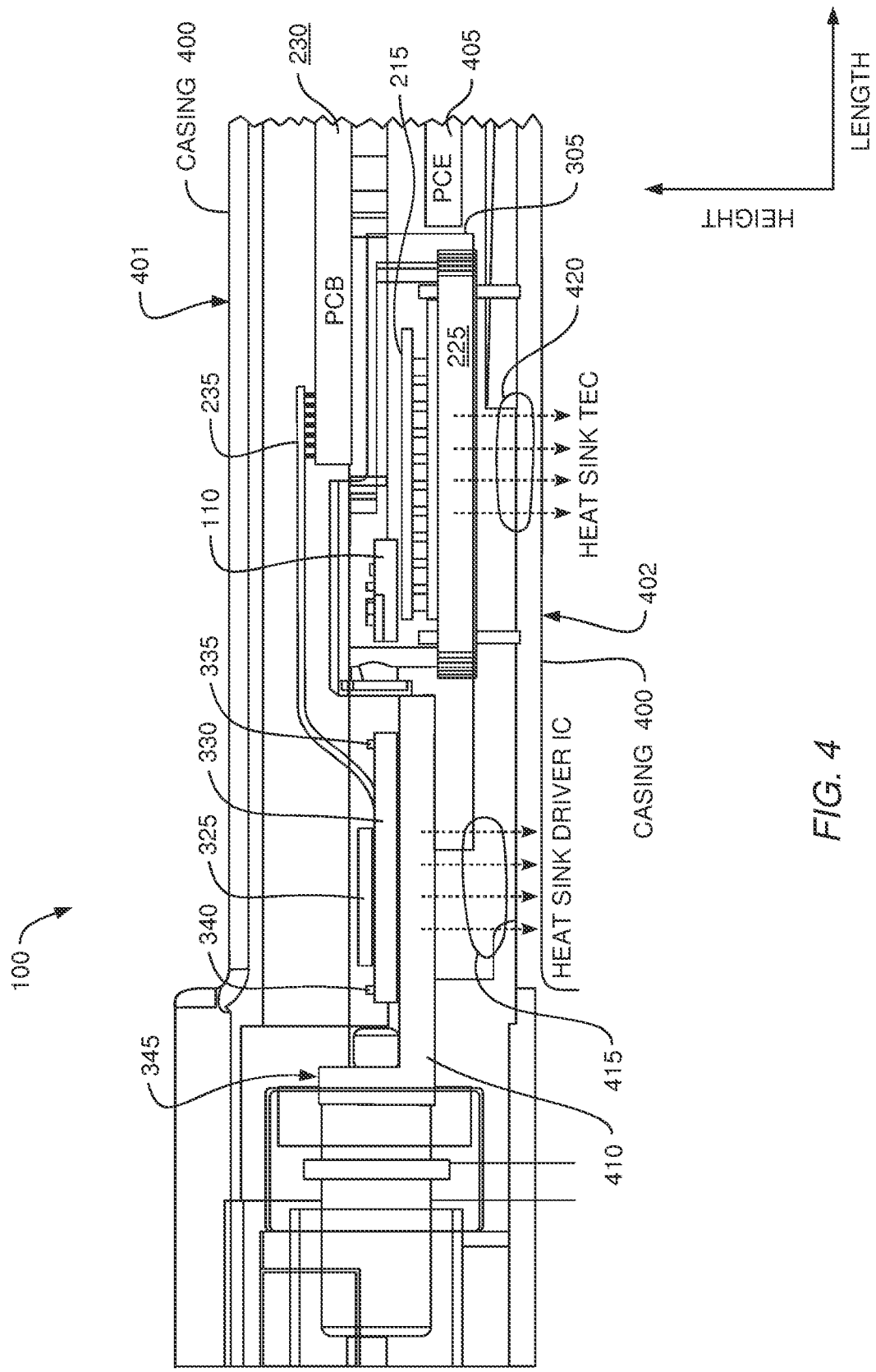
FIG. 4 illustrates an optical transmitter enclosed in a casing, according to one embodiment disclosed herein.

FIG. 4 illustrates the optical transmitter 100 enclosed in an outer casing 400, according to one embodiment disclosed herein. Specifically, FIG. 4 illustrates a cross section of the casing 400 that includes a top side 401 and a bottom side 402 which define two surfaces of the form factor of the transmitter 100. In one embodiment, the casing 400 is made of metallic material but may also be formed from a polymer, plastic, and the like. Moreover, the form factor may have a tubular cross section—e.g., circular or a polygon shape with three or more interconnected sides, or a combination thereof.

The outside height of current QSPF packages to the right of the receptacle 345 is approximately 8.5 mm whereas inside height is typically less than 7.0 mm (due to shell thickness). In one embodiment, by using the arrangement shown in FIG. 4, the transmitter 100 is able to fit within the casing 400 of a QSPF transmitter—i.e., the transmitter 100 may be a QSPF transmitter. For example, at its widest point, which is typically where the enclosure 305, PCB 230 and flex PCB 235 are stacked vertically, the transmitter 100 may have a height that does not exceed 6.5 mm and may be as narrow as 6 mm. That is, even if the flex PCB 235 is disposed between the enclosure 305 and a sidewall of the casing 400, the transmitter 100 still has a form factor that can fit within a casing used by a QSPF transmitter. Moreover, although the bottom and top sides 401, 402 (e.g., the sidewalls of the casing 400) are shown as being planar, these sidewalls may contain multiple planes (e.g., are curved).

Thus, even if the transmitter 100 includes multiple lasers (which may result in using a longer TEC 215 relative to when only one laser is used), the dimensions of the transmitter 100 may fit within the current QSPF casings. For example, as shown, the electrical IC 325 and photonic chip 330 are located externally to the hermetic enclosure 305 and use a separate heat sink 410 and thermal path 415 than a thermal path 420 used to remove heat from the TEC 215. Doing so may reduce the size of the TEC 215 relative to locating the IC 325 and photonic chip 330 inside the enclosure 305 and requiring the TEC 215 to also cool these components.

As shown, the IC 325 and chip 330 are external to the enclosure 305. Flex PCB 235 is used to route RF control signals to IC 325 and chip 330 and is disposed between the enclosure 305 and the top side 401 of the casing 400. Thus, the data signals carried by the flex PCB 235 are routed, at least partially, in a direction parallel to the optical signal outputted by the laser assembly 110. This arrangement permits the optical modulator to receive the optical signal from the assembly 110 and transmit a corresponding modulated optical signal to the receptacle 345 in a common direction—i.e., along the length of the transmitter 100. Because the optical modular receives the optical signal and transmits the modulated signal in the common direction, the width of the transmitter 100 may be reduced relative to a transmitter where the optical modulator receives a signal in first direction but outputs a modulated signal in a second, different direction (e.g., the first and second directions are orthogonal).

Because the arrangement shown in FIG. 4 may free additional room in a QSPF casing (e.g., up to 1 mm assuming the transmitter 100 has a maximum height of 6 mm), the transmitter 100 may include additional components that would otherwise not fit within the form factor of the casing 400. For example, the transmitter 100 may include additional heat sinking elements between the TEC 215 and the bottom side 402 of the casing 400. Improving the thermal path 420 may improve the efficiency of the TEC 215 and reduce the power required for cooling the laser assembly 110. Additionally or alternatively, a PCB may extend either above the flex PCB 235 or below the header 225 which may be used to mount passive components or provide additional signal routing.

The transmitter 100 also includes a daughter or servant PCB 405. Because the PCB 230 may not include enough surface area to accommodate the desired number of passive components or routing lanes, the transmitter 100 may use the daughter PCB 405 (e.g., a rigid PCB) to provide additional surface area. The transmitter 100 includes electrical connections (not shown) such as a cable or wire bonds that electrically couple PCB 230 to the daughter PCB 405.

Figure 5:
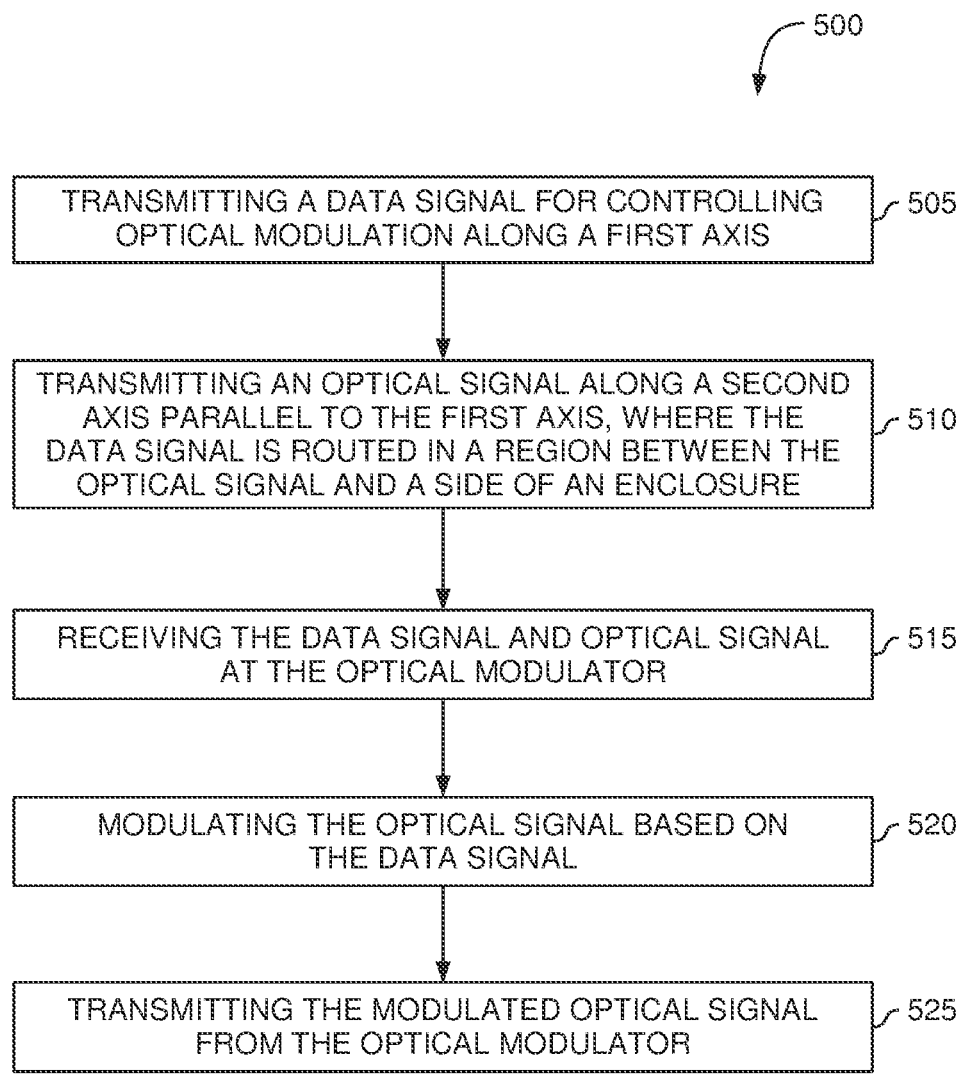
FIG. 5 is a method for transmitting a modulated signal based on the RF signal and optical signal, according to one embodiment disclosed herein.

FIG. 5 is a method 500 for transmitting a modulated optical signal based on RF data signals and an optical signal, according to one embodiment disclosed herein. At block 505, a transmitter propagates one or more data signals for controlling optical modulation along a first axis. At block 510, the transmitter propagates an optical signal along a second axis which is substantially parallel to the first axis— e.g., with some deviation from being perfectly parallel to account for imperfect manufacturing procedures. As described above, the transmitter includes a laser disposed in a hermetic enclosure which generates the optical signal. In addition, the transmitter includes an electrical transmission element (e.g., a flex PCB, cable, wire bonds, and the like) that extends, at least partially, along the first axis. In one embodiment, the electrical transmission element is located between the enclosure and a sidewall of the casing containing the transmitter that extends along a third axis also substantially parallel to the first axis. Thus, in this embodiment, although the first, second, and third axes are parallel and extend in the same direction, the axes are not coincident.

At block 515, an optical modulator in the transmitter receives the data signal and optical signal. In one embodiment, the optical modulator includes a lens in the second axis on which the optical signal propagates. Stated differently, the optical modulator is aligned with the laser assembly in the hermetic enclosure such that the optical signal generated by the laser assembly strikes the input lens. However, this is not a requirement. In other embodiments, one or more mirrors and/or waveguides may be used to direct the optical signal to the input lens on the optical modulator. In this embodiment, the optical modulator would not intersect the second axis but could be located elsewhere in the transmitter.

If the electrical transmission element is flexible (e.g., flex PCB or a cable), in one embodiment, the element may curve or bend to make an electrical connection to the optical modulator. For example, when the electrical transmission element extends into a region between the enclosure and the optical modulator, the medium may begin to curve towards the optical modulator. To do so, the electrical transmission element departs from the first axis and extends in a direction that is not parallel to the second axis on which the optical signal propagates. However, in other embodiments, the electrical transmission element extends only in the direction of the first axis. For example, instead of having to curve to electrical connect to the optical modulator, the optical modulator may intersect the first axis. This arrangement is different than the arrangement illustrated in FIG. 4 where the optical modulator (i.e., electrical IC 325 and photonic chip 330) intersects the second axis but not first axis. In this example, the electrical transmission element can extend along the first axis for its entire length.

Alternatively, even if the optical modulator does not intersect the first axis, the electrical transmission element may be a rigid PCB that extends across the length of the hermetic enclosure. Once the PCB approaches the optical modulator, wire bonds, a cable, or a flex PCB may be used to electrical connect the rigid PCB to the optical modular. Referring to the embodiment shown in FIG. 4, a rigid PCB instead of the flex PCB 235 may be used to carry the data signals across the entire length of the enclosure 305. Moreover, the rigid PCB may continue to extend along the first axis until it overlaps a portion of the photonic chip 330 or IC 325. Wire bonds, cables, or a flex PCB may then be used to electrically connect the rigid PCB to IC 325, chip 330, or both.

At block 520, the optical modulator modulates the optical signal received from the laser assembly using the data signals received from the electrical transmission element. The present disclosure, however, is not limited to any particular type of modulation scheme. Indeed, the embodiments described herein may be used with transmitters that perform any number of different types of modulation that are compatible with Ethernet, Fibre Channel®, InfiniBand®, SONET/SDH, and the like (Fibre Channel and InfiniBand are registered trademarks of the Fibre Channel Industry Association and the InfiniBand Trade Association, respectively).

At block 525, the optical modulator transmits the modulated optical signal to an optical connector. In one example, the optical modulator includes an output lens aligned with a receptacle in the transmitter. The receptacle may include an inner surface that defines an aperture for physically coupling the receptacle to a light carrying medium (e.g., an optical cable). Once a first end of the light carrying medium is inserted into the aperture, the receptacle permits the modulated signal to begin propagating in the medium. In one embodiment, a second end of the light carrying medium is inserted into a receiver that may amplify, decode, retransmit, and/or detect the modulated optical signal.

Moreover, although method 500 described a transmitter that includes one laser, this method equally applies to embodiments where the transmitter includes multiple individual lasers and laser assemblies that generate different optical signals forming different optical channels. The plurality of lasers may be located in the hermetic package and transmit their optical signals to respective input lens located on the optical modulator. In one embodiment, the modulator modulates the individual optical signals based on the data signals received from the electrical transmission element. The optical modulator may then combine the individual modulated signals into a multiplexed or combined modulated optical signal which is then transmitted to the receptacle.

Figure 6:
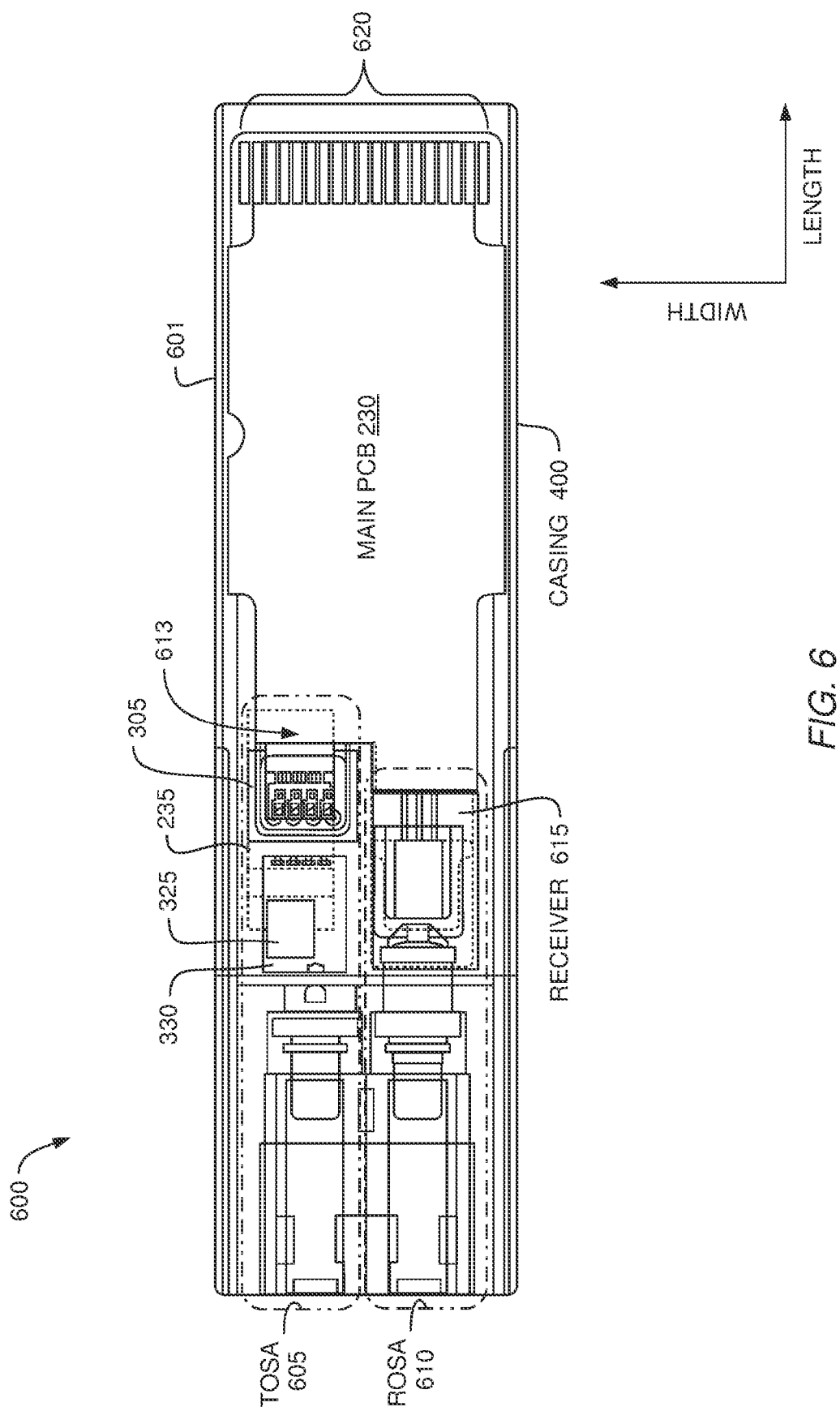
FIG. 6 illustrates a package containing a TOSA and a ROSA in a shared casing, according to one embodiment disclosed herein.

FIG. 6 illustrates a package 600 containing a TOSA 605 and a ROSA 610 in a casing 600, according to one embodiment disclosed herein. Specifically, FIG. 6 illustrates a top view of the outer casing 601 which encloses both TOSA 605 and ROSA 610. In one embodiment, the TOSA 605 includes a transmitter described in the various embodiments accompanying FIGS. 1-5. For example, the TOSA 605 includes an optical modulator formed using the electrical IC 325 and the photonic chip 330. The optical modulator is coupled to the flex PCB 235 which routes the data signals from the PCB 235 to the optical modulator. For clarity, the flex PCB 235 is illustrated as being transmissive so that the enclosure 305, which is occluded by the flex PCB 235, can be seen. Although only the sides of the casing 601 are shown in the top view provided by FIG. 6, as shown in FIG. 4, the flex PCB 235 is disposed between the enclosure 305 and a sidewall of the casing 601 which may be planar or include multiple planes (e.g., is curved).

The flex PCB 235 is electrically and mechanically coupled to the PCB 230 in the PCB connection region 613. This connection may be made using solder, solder bumps, gold bonding (Au stud bonding), wire bonds, and the like. Furthermore, the PCB 230 includes a computing connection region 620 that permits the PCB 230 to communicate with a coupled computing system (e.g., linecard, switch, a server, network device, and the like). For example, the connection region 620 may include a PCI or PCIe connection interface for transferring data between the PCB 230 and the connected communication device. Other connection interfaces may include interfaces compatible with Ethernet, Fibre Channel, InfiniBand, and the like. Regardless of the particular type of the interface, the TOSA 605 uses the interface to receive data signals from the computing system which are then routed from the PCB 230, to the flex PCB 235, and to the optical modulator.

In addition to receiving the data signals using the connection region 620, the TOSA 605 may also transmit information to the coupled computing system. For example, the TOSA 605 may transmit an error code if a hardware component malfunctions or if the received data signals are corrupted. As such, the connection region 620 may facilitate bi-directional communication between the TOSA 605 and the computer system.

The ROSA 610 also communicates with the computing system via the connection region 620. The ROSA 610 contains a receiver 615 which includes one or more components for receiving optical signals. For example, the receiver 615 may include optical lenses, optical detectors, demodulators, control logic, and the like which may be located on any number of different substrates (e.g., integrated circuits, BOX structures, support substrates, etc.). In one embodiment, using the receiver 615, the ROSA 610 receives a modulated optical signal, demodulates/decodes the data carried by the optical signal, and transmits the decoded data using electrical signals to the computing system via PCB 230 and connection region 620. As such, the TOSA 605 and ROSA 610 are integrated into the package 600 to form a transceiver for transmitting and receiving modulated optical signals.

By using the arrangement discussed in FIG. 1-5 in the TOSA 605, the form factor of the casing 601 of the package 600 may be the same as the form factor for other current packages such as QSFP or QSFP+, QSFP28, and Small Form-factor Pluggable (SPF) transceivers. Because the transmitter described above fits into the form factor of these transceivers, the ports of the computing system that couple to the connection region 620 (which may be designed to arrange the packages 600 in a tightly packed array) do not have to be redesigned to accommodate the TOSA described herein. For instance, if the arrangement of the transmitter in the TOSA 605 increased the width of the casing 601 relative to the width of the casing used in a QSPF transceiver, then there may not be enough room to use neighboring ports on a computing device designed to receive a QSPF transceiver. That is, the transmitter may extend into a space reserved for a neighboring transceiver. However, because the transmitter arrangement proposed herein may be used (but does not have to be) in a form factor of currently used transceivers, multiple transceivers may be plugged into neighboring ports on the computing device without requiring the port layout of the computing device to be redesigned.

CONCLUSION

The above described optical transmitter includes an RF signal path that is, at least partially, parallel with an optical signal path. In one embodiment, the electrical transmission element that defines the RF signal path is disposed between a laser emitting the optical signal and a side wall of a casing containing the optical transmitter. Although the RF and optical signals may propagate along different planes within the optical transmitter, both signals are received at an optical modulator. Using the RF signal, the optical modulator modulates the optical signal (e.g., a continuous wave) to generate a modulated signal. The optical modulator then outputs the modulated signal which may then be coupled to a light carrying medium such as a fiber optic cable. By using this arrangement, the optical transmitter may fit within the small form factor of, for example, a QSFP+, QSFP28, or SFP transceiver and still achieve transmission rates greater than or equal to 40 Gb.

Reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the embodiments, features, embodiments and advantages listed above are merely illustrative and are not considered elements or limitations of the appended claims except where explicitly recited in a claim(s).

In view of the foregoing, the scope of the present disclosure is determined by the claim that follow.

We claim:

1. An optical system, comprising:
a laser assembly in a hermetic enclosure;
an optical modulator external to the hermetic enclosure, the optical modulator configured to receive an optical signal generated by the laser assembly and modulate the optical signal based on received data signals;
a casing containing the hermetic enclosure and the optical modulator;
an electrical transmission element disposed between the hermetic enclosure and a sidewall of the casing, the electrical transmission element extends, at least partially, along a first axis that is substantially parallel to both (i) a second axis on which the optical signal propagates between the laser assembly and the optical modulator and (ii) the sidewall, wherein the electrical transmission element is configured to provide the data signals to the optical modulator, wherein the electrical transmission element extends into a region between the hermetic enclosure and the optical modulator, and wherein the electrical transmission element curves in the region towards the optical modulator.

2. The optical system of claim 1, further comprising a receptacle configured to receive the modulated optical signal from the optical modulator and physically couple to a light carrying medium for transmission of the modulated optical signal, wherein the optical modulator is configured to both receive the optical signal from the laser assembly and transmit the modulated optical signal to the receptacle in a common direction.

3. The optical system of claim 2, wherein the receptacle, optical modulator, and hermetic enclosure are arranged along the common direction.

4. The optical system of claim 1, wherein the optical modulator is configured to encode information into the modulated optical signal using the data signals received from the electrical transmission element.

5. The optical system of claim 1, wherein the electrical transmission element comprises a flex PCB, wherein the flex PCB is curved in a region between the hermetic enclosure and the optical modulator.

6. The optical system of claim 1, further comprising a printed circuit board (PCB) coupled to a first end of the electrical transmission element and configured to provide the data signals to the electrical transmission element, wherein the first end of the electrical transmission element is opposite to a second end of the electrical transmission element that is directly solder bonded to an electrical integrated circuit that is a part of the optical modulator.

7. A method for operating an optical transmitter, comprising:
transmitting data signals on an electrical transmission element, wherein a portion of the electrical transmission element extends along a first axis;
transmitting an optical signal from a hermetic enclosure to an optical modulator along a second axis parallel to the first axis, wherein the portion of the electrical transmission element is disposed between the hermetic enclosure and a sidewall of a casing of the optical transmitter that is parallel to the first axis, wherein the electrical transmission element extends into a region between the hermetic enclosure and the optical modulator, and wherein the electrical transmission element curves in the region towards the optical modulator;
receiving the data signals and the optical signal at the optical modulator; and
modulating the optical signal based on the data signals.

8. The method of claim 7, further comprising:
transmitting the modulated optical signal from the optical modulator to a receptacle, wherein the receptacle is physically coupled to a light carrying medium for transmission of the modulated optical signal out of the optical transmitter.

9. The method of claim 8, wherein the optical modulator receives the optical signal from the hermetic enclosure and transmits the modulated optical signal to the receptacle in a common direction.

10. The method of claim 7, wherein modulating the optical signal based on the data signals further comprises encoding information into the optical signal using the data signals received from the electrical transmission element.

11. The method of claim 7, further comprising, before transmitting the data signal on the electrical transmission element, receiving the data signals from an external computing system coupled to a PCB.

12. The method of claim 10, wherein the electrical transmission element is flexible and is curved for at least a portion of its length.

13. The method of claim 7, further comprising transmitting the data signals on a PCB coupled to a first end of the electrical transmission element and configured to provide the data signals to the electrical transmission element, wherein the first end of the electrical transmission element is opposite to a second end of the electrical transmission element that is directly solder bonded to an electrical integrated circuit that is a part of an optical modulator.

14. An optical transmitter comprising:
   a laser in a hermetic enclosure;
   an optical modulator comprising an electrical integrated circuit (IC) bonded to a photonic chip, wherein the electrical IC is configured to receive an optical signal generated by the laser assembly and the photonic chip is configured to modulate the optical signal based on control signals received by the electrical IC, and wherein the optical modulator is external to the hermetic enclosure;
   a receptacle configured to receive the modulated optical signal from the optical modulator and physically couple to a light carrying medium for transmission of the modulated optical signal, wherein the optical modulator is configured to both receive the optical signal from the laser assembly and transmit the optical signal to the receptacle in a common direction; and
   an electrical transmission element disposed between the hermetic enclosure and a sidewall of the casing and is configured to provide the data signals to the optical modulator, wherein the electrical transmission element extends into a region between the hermetic enclosure and the optical modulator, and wherein the electrical transmission element curves in the region towards the optical modulator.

15. The optical transmitter of claim 14, further comprising:
   a casing containing the hermetic enclosure and the optical modulator; and
   the electrical transmission element extending from a first end of the hermetic enclosure to a second, opposite end of the hermetic enclosure, the electrical transmission element is electrically coupled to the optical modulator.

16. The optical transmitter of claim 15, wherein the optical modulator is configured to encode information into the modulated optical signal using the data signals received from the electrical transmission element, and
   wherein a portion of the electrical transmission element extends on a first axis that is parallel to a second axis defining an optical path of the optical signal when being transmitted from the laser assembly to the optical modulator.

17. The optical transmitter of claim 15, wherein the electrical transmission element is flexible and is curved for at least a portion of its length.

18. The optical transmitter of claim 14, further comprising:
   a PCB coupled to a first end of the electrical transmission element and configured to provide the control signals to the electrical transmission element and the electrical IC, wherein the first end of the electrical transmission element is opposite to a second end of the electrical transmission element that is directly solder bonded to the electrical IC.

* * * * *

UNITED STATES PATENT AND TRADEMARK OFFICE
CERTIFICATE OF CORRECTION

PATENT NO. : 9,628,185 B2
APPLICATION NO. : 14/517414
DATED : April 18, 2017
INVENTOR(S) : Stefan Martin Pfnuer et al.

It is certified that error appears in the above-identified patent and that said Letters Patent is hereby corrected as shown below:

In the Specification

In Column 7, Line 18, delete "QSPF" and insert -- QSFP --, therefor.

In Column 7, Line 23, delete "QSPF" and insert -- QSFP --, therefor.

In Column 7, Line 24, delete "QSPF" and insert -- QSFP --, therefor.

In Column 7, Line 31, delete "QSPF" and insert -- QSFP --, therefor.

In Column 7, Line 38, delete "QSPF" and insert -- QSFP --, therefor.

In Column 7, Line 66, delete "QSPF" and insert -- QSFP --, therefor.

In Column 10, Line 61, delete "QSPF" and insert -- QSFP --, therefor.

In Column 10, Line 63, delete "QSPF" and insert -- QSFP --, therefor.

Signed and Sealed this
Twentieth Day of June, 2017

Joseph Matal
*Performing the Functions and Duties of the*
*Under Secretary of Commerce for Intellectual Property and*
*Director of the United States Patent and Trademark Office*